United States Patent [19]

Koehler et al.

[11] 4,446,422

[45] May 1, 1984

[54] METHODS OF AND APPARATUS FOR DETECTING, MEASURING, AND CLASSIFYING INSULATION DEFECTS

[75] Inventors: Paul G. Koehler; Thomas P. Leahy; Thomas P. Lichliter, all of Omaha, Nebr.

[73] Assignee: AT&T Technologies, Inc., New York, N.Y.

[21] Appl. No.: 324,367

[22] Filed: Nov. 24, 1981

[51] Int. Cl.³ .................. G01R 31/12; G01R 31/08
[52] U.S. Cl. ....................................... 324/54; 324/52
[58] Field of Search ............... 209/571, 573, 600, 604; 324/52, 54

[56] References Cited

U.S. PATENT DOCUMENTS

| | | |
|---|---|---|
| 1,952,582 | 3/1934 | Cary . |
| 2,750,562 | 6/1956 | Starr . |
| 2,753,521 | 7/1956 | Abrams . |
| 2,809,348 | 10/1957 | Kellog . |
| 2,894,209 | 7/1959 | Ctambrill ............................ 324/54 |
| 3,277,365 | 10/1966 | Doran . |
| 3,323,701 | 6/1967 | Gurski . |
| 4,164,703 | 8/1979 | Boggs . |

Primary Examiner—Ernest F. Karlsen
Assistant Examiner—Jose M. Solis
Attorney, Agent, or Firm—E. W. Somers

[57] ABSTRACT

During the manufacture and/or packaging of insulated conductors, insulation defects are detected, measured, and classified by the methods and apparatus of this invention. As a twisted pair of insulated conductors (21-21), for example, is advanced along a manufacturing line (25), the insulation covers (23-23) are engaged by a probe (32) which is connected to a source of electrical power and to an electrical circuit (30). The circuit is adapted to process signals received from the probe and to make comparisons with stored signals to indicate the occurrence of pinholes, faults or bare wire in the insulation covers. In order to be accurate in its comparison and classification, the circuit includes provisions for correcting for current flow between the probe and the metallic conductors prior to and subsequent to the pair being moved through the probe and for the thickness of the probe. Depending upon the nature of the defect and its frequency of occurrence, the circuit may be caused to discontinue further operation of the line.

20 Claims, 7 Drawing Figures

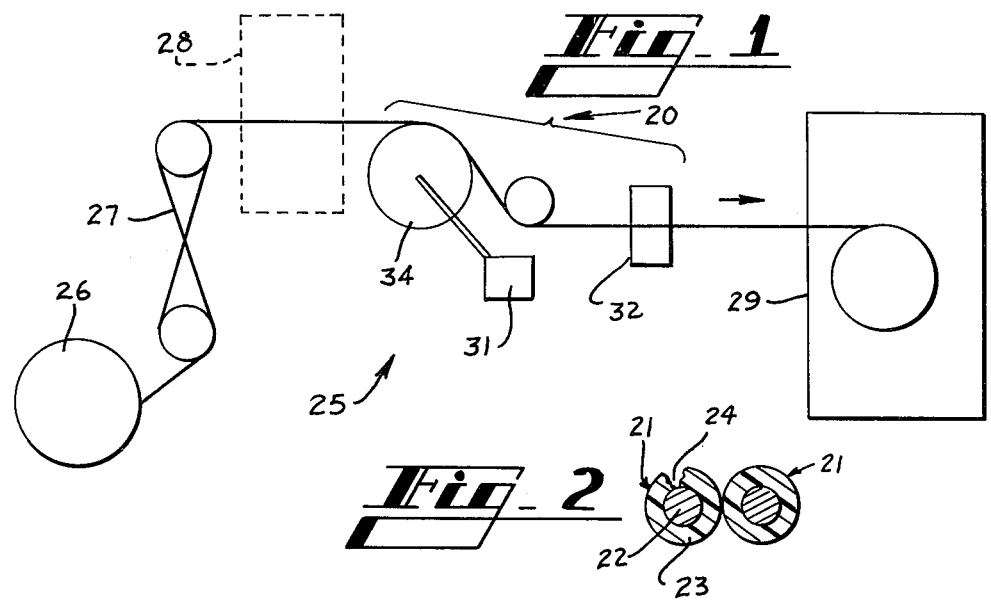
Fig_1
Fig_2
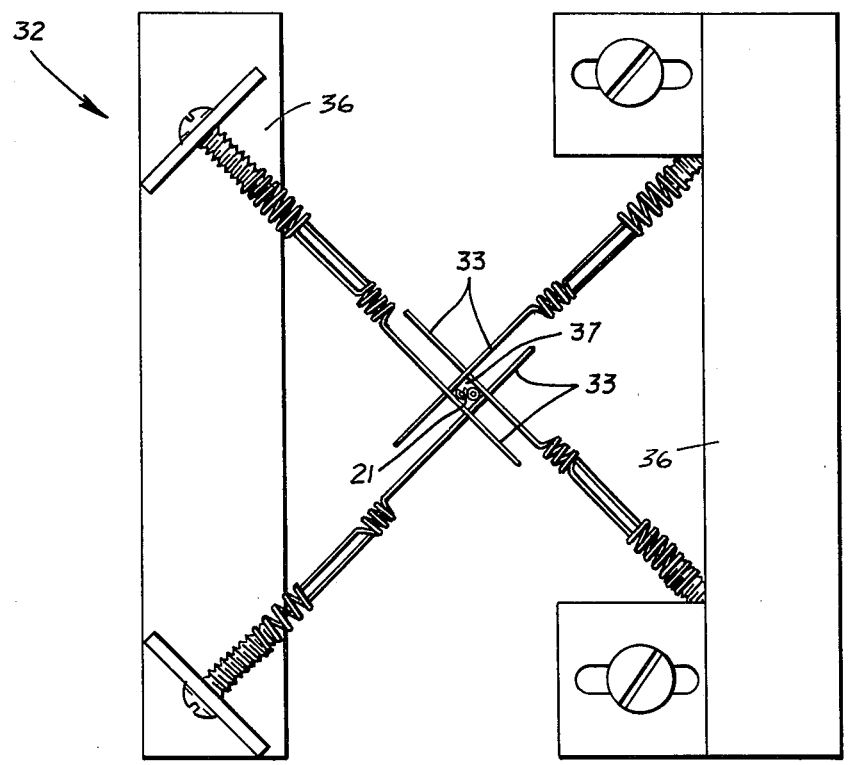
Fig_4

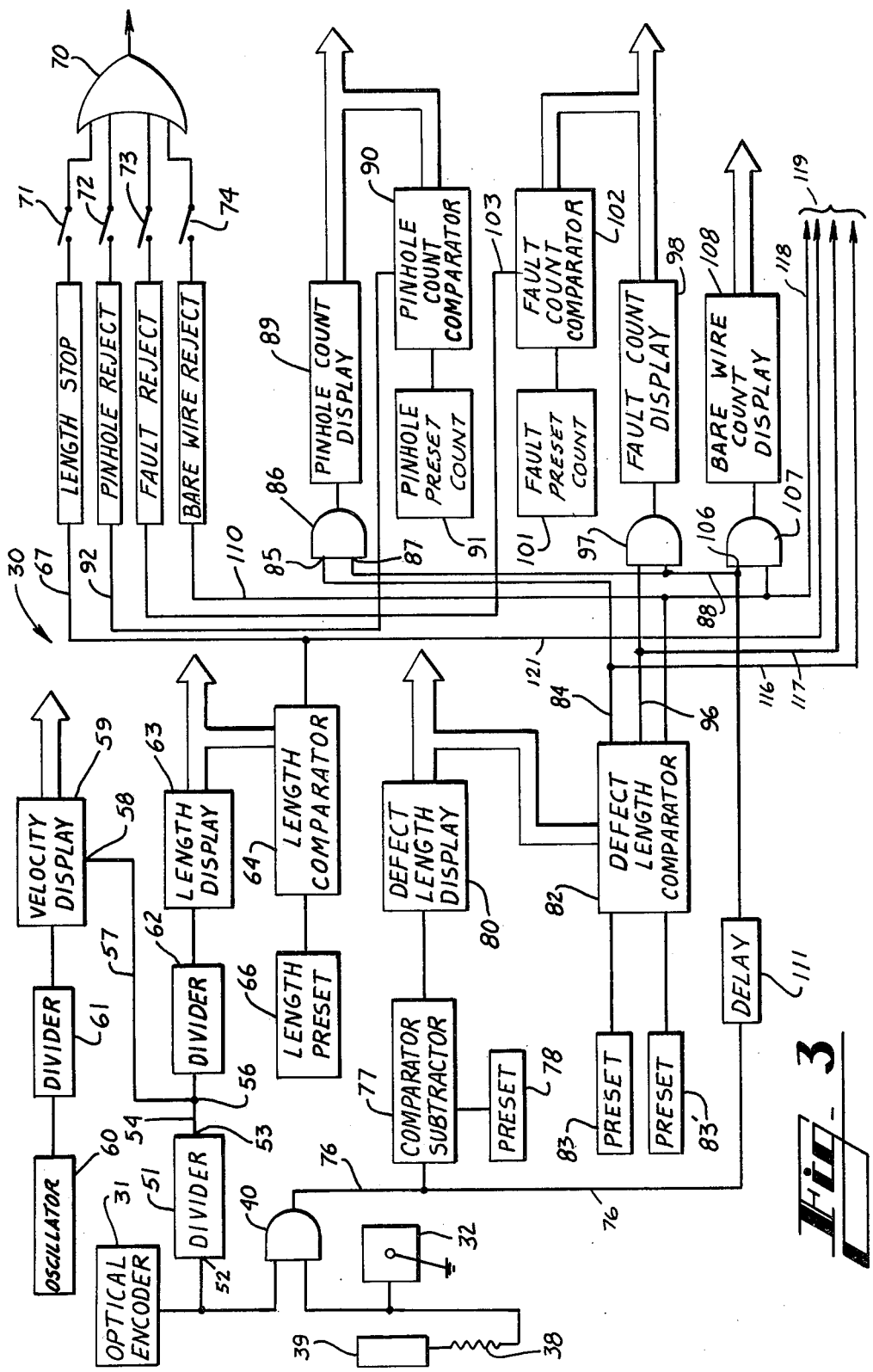
FIG_3

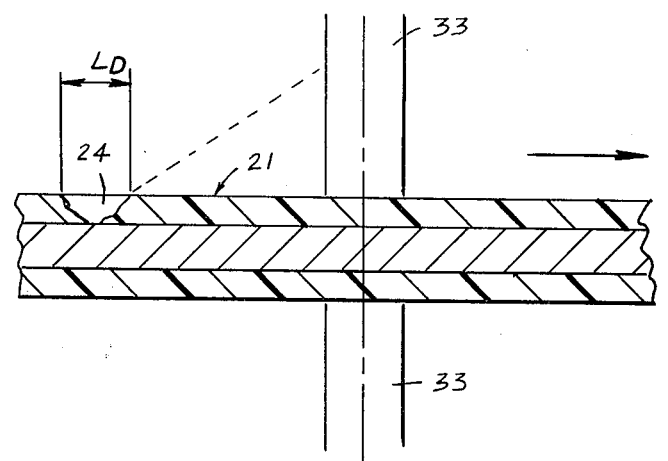
Fig. 6A
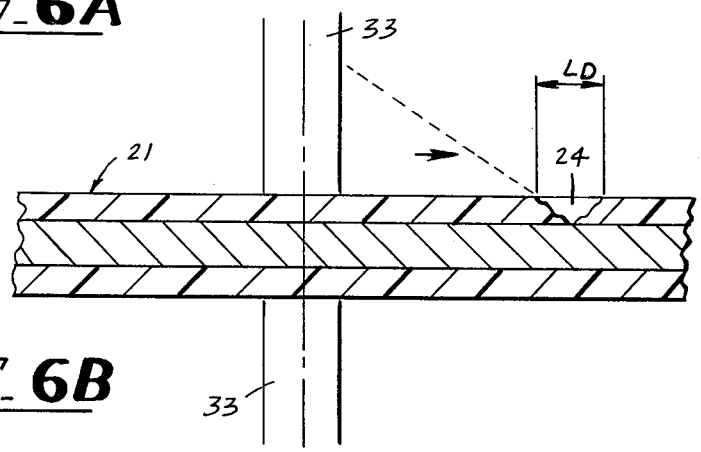
Fig. 6B
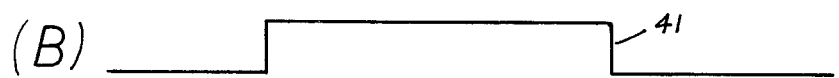
Fig. 5

METHODS OF AND APPARATUS FOR DETECTING, MEASURING, AND CLASSIFYING INSULATION DEFECTS

TECHNICAL FIELD

This invention relates to methods of and apparatus for detecting, measuring, and classifying insulation defects. More particularly, the invention relates to the classification of conductor insulation defects into defined categories and to the accumulation of the number of each kind of defect in a given length of conductor.

BACKGROUND OF THE INVENTION

In the communication industry, billions of feet of insulated metallic conductors are manufactured each year. These conductors have many users. For example, they are used to connect distributing frames inside central offices, as inside wiring to provide service to customer station apparatus, and are twisted into pairs and stranded into cables.

Insulation which covers the metallic conductors must be relatively free of defects if it is to prevent shorting between adjacent conductors and ground when the conductors are placed into service. Accordingly, in the manufacture of insulated conductors, it is customary to test the insulation for defects. Defects may include uninsulated portions of the conductor as well as splits in the insulation or inadequate thickness thereof. Depending on the kinds of defects and the number of each in a given length, the insulated conductor may be accepted or rejected.

Defects are classified as pinholes, faults, or bare wires. A pinhole is defined as a defect in the insulation which is not visible to the naked eye. An insulated conductor may include a plurality of these and still be acceptable for use. A second kind of defect if referred to as a fault, and a third is that referred to as bare wire. Typically, a pinhole has a length which is less than 0.03 inch; a fault, a length of at least 0.03 inch but no greater than 0.25 inch; and a bare wire, a length greater than 0.25 inch.

One of the common tests for defects is to apply a voltage across the insulation. The voltage is many times higher than that which will be encountered during the service life of the insulated conductor. Any insulation defect, which may be troublesome during service, is detected by the flow of an electrical current through the insulation at the defect.

To subject conductor insulation to a relatively high voltage test, apparatus which is referred to as a spark-tester is commonly employed. The spark-tester apparatus is positioned between a supply of the insulated conductor and a takeup and in the path of travel of the conductor. One end of the insulated conductor is connected to ground, and a relatively high voltage is impressed across the insulation of the conductor as it advanced from its supply to the takeup. Any defect in the insulation will be manifested by a spark or arc between the spark-tester apparatus and the metallic conductor at the point in the insulation where the defect occurs.

In one prior art spark-tester apparatus, a plurality of beaded-chain electrodes are connected to a high voltage source and are disposed in a path of travel of an insulated conductor. As the insulated conductor is moved past the chains, a high voltage potential is impressed across the insulation and causes an arc over between the chains and an uninsulated portion of the conductor 21. Such an apparatus is described in U.S. Pat. No. 2,753,521. While apparatus such as this has been used for a number of years, it does not allow the classification of defects which is required for a suitable disposition of the insulated conductor.

Another commercially available test set, which includes two separate power supplies, distinguishes only between a fault and a bare wire. One portion of the test set detects fault-to-ground current while the other includes two probes which are spaced about one inch apart. The probes cannot be placed closer than one inch without an inadvertent breakdown from one probe to another. A fault as defined by this test set is any defect which is less than one inch in length whereas a bare wire is classified as one having a defect length of one inch or more.

This kind of arrangement, which has been used for some time, has certain disadvantages. For example, the above-described one inch length separation point between categories of defects, on which is based the acceptance or rejection of insulated conductors, is not altogether satisfactory. Conductors having faults of 0.25 inch or longer have been known to short out, and yet in the factory, such an insulated conductor would not have been rejected because the defects were not greater than one inch in length. It appears that, those in this art have not been able to distinguish among defects in a manner which is consistent with performance requirements.

As should be evident, there is a need in the art for methods and apparatus for not only detecting in conductor insulation but also for being able to measure these defects to permit a meaningful classification. It is also important that a conductor having an excessive number of defects will be identified and either rejected or repaired. Moreover, such an apparatus should be relatively economical, and hopefully be able to be used to detect defects in cable jackets as well as in conductor insulation. Seemingly, these needs have not been met by the prior art.

SUMMARY OF THE INVENTION

The foregoing needs have been met by the methods and apparatus of this invention. A method of this invention includes steps which result in the classification of defects in conductor insulation, for example. Successive increments of length of a metallic conductor which is covered by insulation are advanced along a manufacturing line through an opening provided by a plurality of metallic fingers of a probe. The opening is sized to be less than the outer diameter of the smallest conductor that is expected to be tested. The probe is connected to an electrical circuit which causes a voltage to be impressed across the insulation between the probe and the metallic conductor to cause an electrical current to flow between the probe and the metallic conductor at the location in the insulation where a defect exists.

A pulse train which is a measure of the length of the conductor being advanced past the probe is generated and processed to determine the length of the defect as well as its location. A portion of the pulse train is a measurement of the sum of a distance along the conductor between the initiation and the termination of the current flow and the length of the defect. Inasmuch as the current flow occurs prior and subsequent to the movement of the defect past the probe and because the probe has a finite width, the measured distance is somewhat erroneous as a defect length measurement. This is corrected by causing a predetermined pulse count to be subtracted from the portion of the pulse train. The predetermined pulse count compensates for the flow of the current prior and subsequent to the defect passing the probe and for the thickness of the probe along the path of travel. Its subtraction from the portion of the pulse count results in a corrected pulse count. The corrected pulse signal is porportional to the length of the defect.

The corrected pulse count which is provided as a result of a defect being advanced past the probe is then released and compared to preset length categories to facilitate decisions among pinhole, fault and bare wire type defects. Depending on the classification of the defect in accordance with its length, a counting portion of the circuit stores the occurrence of the defect and compares the cumulative count of each kind of defect with a stored number.

For some product lines, once the stored number is reached or exceeded, a signal is provided to a gate which causes the operation of the manufacturing line to be discontinued. For other products, the reel of tested, insulated conductor may be sent to a facility where the conductor is payed out to the exact locations of the defects and repaired.

BRIEF DESCRIPTION OF THE DRAWINGS

Other features of the present invention will be more readily understood from the following detailed description of specific embodiments thereof when read in conjunction with the accompanying drawings, in which:

FIG. 1 is a schematic view of an apparatus of this invention in position on a manufacturing line for testing defects in conductor insulation;

FIG. 2 is an enlarged end view in section of a pair of insulated conductors which are tested by the methods and apparatus of this invention;

FIG. 3 is a schematic diagram of an electrical circuit embodying the methods and apparatus of this invention;

FIG. 4 is an enlarged view of a probe of the apparatus of this invention for engaging insulation of conductors being advanced along a manufacturing line;

FIG. 5 is a diagram illustrating wave forms which are present at various points in the electrical circuit; and FIGS. 6A and 6B are side elevational views of the probe of FIG. 4 to show an electrical arcing from the probe to an insulation defect prior to and subsequent to the alignment of the defect with the probe.

DETAILED DESCRIPTION

Referring now to FIG. 1, there is shown an apparatus designated generally by the numeral 20 for detecting, measuring, and classifying insulation defects of a twisted pair of insulated conductors 21-21 (see FIG. 2). Each insulated conductor 21 includes a metallic conductor 22 and an insulation cover 23 which may be comprised of a plastic material, for example. In FIG. 2, an insulation defect appears at 24. It should be noted that the defect may be a crack or split in the insulation as well as missing insulation and as well as thin or otherwise unacceptable insulation. Also, it should be noted that the methods and apparatus of this invention may be used to measure and to classify insulation defects not only of a pair of insulated conductors but also of a single conductor or a plurality of singles or pairs which are stranded together.

The apparatus 20 of this invention is embodied in a manufacturing line which may be used, for example, to pay off given lengths from a supply reel to a coil or to insulate conductor or to further process an insulated conductor or a pair or a cable. One such line is that shown in FIG. 1 and is designated generally by the numeral 25. It includes a supply 26 of an insulated conductor pair, a capstan 27, an apparatus 28 for treating the insulated conductor such as, for example, an irradiation cross-linking apparatus, the measuring apparatus 20, and a takeup 29. The classification of defects along a length of the insulated conductor pair is made following the detection and the measurement of the defects.

The apparatus 20 of this invention includes an electrical circuit which is designated generally by the numeral 30 (see FIG. 3), an optical encoder 31 and a probe 32 (see FIG. 4) which provide inputs to the circuit. The optical encoder is connected to a measuring sheave 34 (see FIG. 1). The output of the optical encoder 31 is provided to a portion of the circuit 30 for purposes of length and velocity display and is gated to another portion of the circuit which classifies the insulation defects. In a preferred embodiment, the optical encoder 31 is one marketed by Dynamics Research Corporation and provides 1000 counts per revolution of the encoder. Through the use of suitable gearing and timing belts, the input of the optical encoder 31 to the circuit 30 becomes 1200 pulses per foot of the conductor pair being advanced past the sheave 34. The input to the circuit 30 is a train of pulses 35 (see FIG. 5A), hereinafter referred to as a pulse signal or pulse count.

The probe of this invention which is designated 32 is effective to detect insulation defects advanced therepast. It includes four wire-like fingers 33-33 (see FIG. 4) which are made of a spring steel, for example. Each of the fingers 33-33 is cantilevered from a support block 36. As is seen from the drawing, the fingers 33-33 are arranged so that their free ends form a generally square opening 37 through which an insulated conductor 21 extends. Because the fingers 33-33 are made of spring steel and because the opening is sized to be less than the diameter-over-dielectric (DOD) of the smallest expected conductor, the fingers engage the smallest DOD conductor as well as the largest or a pair thereof. The pair of insulated conductors 21-21 is advanced through the opening 37 with at least one and preferably all of the fingers engaging the insulation covers 23-23 of the metallic conductors 22-22.

For measuring defects in the insulation for as many as six conductors, it has been found that the probe 32 need include only four fingers 33-33. However, when measuring insulation defects in a group exceeding six, or for defects in jacketing, it has been found that additional fingers are required.

The fingers 33-33 of the probe 32 are connected electrically through a current limiting resistor 38 having a resitance of about $1 \times 10^6$ ohms to a relatively high voltage electrical source of power 39 and to the test circuit 30 (see FIG. 3). In a preferred embodiment, the voltage is 3000 volts D.C. with a maximum of 6000 volts. Ends of the metallic conductors 22-22 at either the supply 26 or the takeup 29 are bared and connected through a relatively small, e.g., 1 ohm, resistor to ground.

With this arrangement, the passage through the opening 37 of a portion of the pair of insulated conductors 21-21 in which there exists a defect in the insulation causes arcing from the probe 32 to the metallic conductor 22 underlying a defect. This causes a signal which is referred to as a window 41 (see FIG. 5B) to be generated and provided as an input to the circuit 30. Generally, a gate 40 of the electrical circuit 30 is caused to be opened while current is flowing from the probe 32 to the metallic conductor 22 to permit the pulse signal (see FIG. 5A) from the length measurement to pass through.

Turning again to FIG. 3, it is seen that the circuit 30 includes a divider 51 which receives the output of 1200 pulses per foot of conductor at an input 52. The divider 51 divides the output of the optical encoder 31 to provide 100 pulses per foot at an output 53.

The output of the divider 51 is passed along a line 54 to a junction point 56 and then along a line 57 to an input 58 of a velocity display 59. The velocity display 59 may comprise four integrated circuits such as ones marketed by Texas Instruments under the designation T1L 307. These integrated circuits are connected together to provide an output from 0 to 9999 feet per minute.

Provisions are made for updating the signal from the velocity display 59 every 0.6 second. A $1 \times 10^6$ hz oscillator 60 provides an input to a divider 61. The divider 61 includes five integrated circuits, four designated 7490, each of which divides by 10, and one designated 7492 which divides by 6. Integrated circuits of the 7400 series may be obtained from the National Semiconductor Company, Signetics Company, or Texas Instruments, for example.

The divider 51 provides an output comprising two signals every 1/100 minute to the velocity display 59. One of these signals is a latching signal which causes the velocity display 59 to latch the total count of pulses that is received by the velocity display in the last 1/100 minute. The other one of the two signals is a reset signal which allows the velocity display to begin counting for another 1/100 minute so that the velocity displayed is the velocity of the insulated conductor pair in feet per minute.

The output of the divider 51 is further divided by 100 by a subcircuit 62 to provide an output of 1 pulse per foot. This signal is provided as an input to a length display 63 which is used to monitor the length of the conductor pair which has passed through the probe 32. In connection therewith, the length display 63 provides to a comparator 64 a signal which is indicative of the cumulative length of the insulated conductor pair. The comparator 64 may be a printed circuit board which includes a plurality of OR and AND gates and an integrated circuit designated 7485 such as one available from the Signetics Company and identified as IC TTL 7485. The comparator 64 also receives a signal from a length preset 66 which is a stored quantity corresponding to the pair length to be processed before the operation of the line 25 is discontinued. In a preferred embodiment, the preset 66, as well as the other presets included in the circuit 40, is a digital switch such as one manufactured by the Durant Company of Watertown, Wisc. The digital switch displays numbers from 0 to 9 and provides a binary coded decimal (BCD) of that number as an output to the comparator 64. When the input signal from the length display 63 equals the preset count, the length comparator 64 provides a signal along a length stop line 67 to an OR gate 70.

The OR gate 70 is connected to the circuit 30 so as to be opened upon the occurrence of any selected event or the occurrence of any predetermined combination of events. This is accomplished by connecting portions of the circuit 30 to the OR gate 70 through switches 71, 72, 73, and 74. For example, it may be preset to be effective upon receiving a signal from the length comparator 64 through a closed switch 71. Or it may be operated upon receipt of a pinhole reject signal, a fault reject signal or a bare wire reject signal. Upon the occurrence of any preselected one or combination of such predetermined events, the OR gate 70 is caused to be operated. The operation of the OR gate 70 controls a relay (not shown) to cause the operation of the line 25 to be discontinued or an alarm (not shown) to be sounded.

Turning now to the detection, measurement, and classification of insulation defects, attention is directed to the defect signal caused by the effective electrical engagement of one or more of the probe fingers 33-33 with the insulated conductor pair. The output of the optical encoder 31, which is the pulse train 35 (see FIG. 5A), is provided as a constant input to the AND gate 40 of the circuit 30. As will be recalled, as a result of an insulation defect being advanced past the fingers 33-33, a signal from the probe 32, which is termed the window (see FIG. 5B), is provided as the other input to the AND gate 40. This causes the AND gate 40 to be opened to allow a portion 75 of the pulse train 35 (see FIG. 5C) from the optical encoder 31 to pass therethrough to the measurement and classification portions of the circuit 30. As a result, the circuit 30 measures and classifies each defect. The portion 75 of the pulse train in FIG. 5C is applied over a line 76 and as an input to a length arc comparator and subtractor 77 for the width of the window 41. The portion of the pulse train passes through to the comparator 77 as long as a window signal is provided to the AND gate 40 as a result of current flow between the probe 32 and a metallic conductor 22.

The circuit 30 includes provisions for correcting the portion 75 of the pulse signal which is received by the comparator 77 to compensate for the premature and late arcing between the probe 32 and the metallic conductor 22. The probe 32 not only arcs over to a defective portion of the insulation 23 before the defect is aligned with the probe 32 but the arcing continues for a distance after the defect has passed the probe.

Referring now to FIG. 6A, it can be seen that as each defect, having a length "$L_D$", approaches the probe 32, the high voltage arcs (see broken line in FIG. 6A) to the portions of the metallic conductor underlying the defect. The arc holds as it passes through the probe 32 and for some distance afterwards (see FIG. 6B). The arc which depends on the magnitude of the voltage and amount of moisture in the air, has been found to be fairly constant. In order to obtain an accurate classification, it is necessary to provide a correction to the measurement portion of the circuit 30 to provide a corrected pulse count. Accordingly, the length arc comparator and subtractor 77 cooperates with an arc length preset 78 to provide a correction for measurement errors caused by premature and late termination of the arc.

If the probe 32 were substantially planar, the only correction needed would be that to compensate for the distances prior to and subsequent to the probe during which the arcing and current flow occurs. However, the probe 32 has a finite width along the path of travel of the metallic conductor 22. In order to determine the length of each defect to accurately classify it, the pulse signal must be not only corrected for the premature and late arcing and the probe 32 but also must be rendered two dimensional in a plane normal to the conductor. Inasmuch as the probe itself does not mechanically satisfy this condition, the electrical circuit 30 also includes provisions for causing the probe to be effectively planar.

The correction is a preset pulse count which is stored in the arc predetermined 78 and which is representative of the sum of the distance before and after the probe during which arcing occurs and of the thickness of the probe along the path of travel of the conductor pair. The predetermined pulse count is designated 79 and is shown in broken lines in FIG. 5D. It is determined by running an insulated conductor having a measured defect past the probe in a plurality of passes. The defect which in an initial pass has a length of one inch is decreased in steps to about ½ inch until a correction which has an average of the errors in the probe reading is determined. This correction becomes a subtraction from the measured length portion 75 of the pulse count in the circuit 30 of the apparatus 20. The measured length portion 75 of the pulse count which is shown in the window 41 of the signal from the probe (see FIG. 5C) is representative of the sum of a distance along the path of travel of the conductor pair from the initiation to the termination of the arc or current flow between the probe 32 and the metallic conductor underlying the defect and of the length of the defect 24. For non-planar probes such as the one shown in FIG. 4, the distance also accounts for the thickness of the probe. The arc correction is variable and is user set.

In the operation of the apparatus 20, the portion 75 of the pulse count 35 is supplied through the gate 40 when opened by the window signal 41 from the probe 32 to the comparator 77. The comparator 77 counts up to the arc correction which is the predetermined pulse count 79 that is proportional to the distance and then releases the remainder of the portion of the pulse count from the AND gate 40 to a defect length display 80. The released portion 81 of the pulse count is shown in solid lines in FIG. 5D and is referred to as the corrected portion of the pulse count or simply the corrected pulse count.

The length display 80 is connected to a defect length comparator 82 which is preset with two preset storage bytes 83 and 83'. A first of these, byte 83, represents the separation between categories defined as pinholes and faults. The second corresponds to the separation between a fault and a bare wire.

In operation, the comparator 82 is effective to consider the corrected pulse count which is representative of the length of the defect. If it is less than the first storage byte, an output is provided along a line 84 to an input 85 of an AND gate 86. The other input 87 of the AND gate 86 is a signal from the AND gate 40 along the line 76 to a common line 88. This causes the AND gate 86 to be opened and to provide a signal to a pinhole count display 89 which inputs a pinhole count to a comparator 90.

The pinhole count comparator 90 compares the cumulative count of pinholes with a number which is stored in a pinhole preset count 91. Should the cumulative number exceed that of the number stored in the preset 91, the pinhole count comparator 90 provides a signal along a line 92 to the OR gate 70. As is seen from the drawing, the line 92 is routed through a switch 72 to the OR gate.

Depending on the product being tested, the operation of the line 25 may or may not be discontinued after a predetermined number of defects have been reached. If the former, and if the switch 72 is closed, then the OR gate 70 upon receipt of a signal from the comparator 90 provides an output signal which can be used to discontinue the operation of the line. On the other hand, if the switch 72 is open, the OR gate is not caused to be opened and the pinhole count is accumulated. The reel of the pair of insulated conductors 21-21 which has been determined to have too many pinholes is removed and may be sent to a repair station.

As a second possibility, the defect length comparator 82 may classify the defect as a fault. In that event, a signal is sent along a line 96 to an AND gate 97 which is associated with a fault count display 98. The AND gate 97 also receives a second input from the AND gate 40 via the line 76 and the common line 88. At any time, should the fault count display exceed that of a fault count from a preset 101 as determined by a comparator 102, a signal is sent along a line 103 to the OR gate 70 to cause the OR gate to produce an output signal which may be used to discontinue the operation of the line.

In the event that the defect is a bare wire, the comparator 82 provides a signal to an input 106 of an AND gate 107. The AND gate 107 also receives an input from the AND gate 40 when an insulation defect is sensed by the probe 32. The AND gate 107 inputs a bare wire count display 108, and at the same time a signal is provided along a line 110 to the OR gate 70, which again may be used to cause the line operation to be discontinued.

The circuit 30 also includes a delay device 111 along the line 76 for blocking the measured portion 75 of the pulse signal from the AND gate 40 to the common line 88 until a classification decision has been made by the defect length comparator 82. In a preferred embodiment, the device 111 is an integrated circuit such as one designated 74123 and available from the Signetics Company which is effective to release the signal from the AND gate 40 at the conclusion of the defect signal which occurs at the trailing edge of the final pulse of the measured portion of the pulse signal along the line 76. For assurance, the device 111 may be controlled to release the pulse signal only following a predetermined number of pulses after the final pulse of the measured portion of the pulse signal. By releasing the signal to the common line 88 at this time, the circuit is assured that a classification decision has been made by the comparator 82 in accordance with the measured length of the defect. In this way, a signal is not provided to the input of any of the gates 86, 97, and 107 until after that decision has been made. If it were released prior to the classification decision, and if the defect was a bare wire, all three gates 86, 97, and 107 would be opened since the comparator would count up to the second classification level of the preset 83' which separates fault defects from bare wires.

The apparatus 20 of this invention contributes to the efficient operation of any insulating or conductor processing line. It is capable of detecting insulation defects and of measuring them so that they can be classified as pinholes, faults or bare wire defects. As a result of these classifications which are maintained in separate cumulative counts, a decision is made as to the disposition of the insulated conductor or pair being tested. It has been found that the detection, measurement and classification apparatus 20 of this invention is accurate to within about 1/20th of an inch.

It should be readily apparent that the circuit 30 may also include provisions for correlating defects with the length of the insulated conductor pair being advanced along the manufacturing line. For example, each of the outputs of the comparator 82 along lines 116, 117, and 118 may be connected to an output plug 119 which could be used to provide an input to a microprocessor (not shown) which also receives an input along a line 121 from the length display 63. With this arrangement, whenever a pinhole, bare wire or fault occurs, the microprocessor which also includes a printer causes the location and the type of the defect to be identified on a print out of the length. In this way, repairs become less costly since the reel of the insulated conductor pair can be payed out to the exact location of the defect.

It is to be understood that the above-described arrangements are simply illustrative of the invention. Other arrangements may be devised by those skilled in the art which will embody the principles of the invention and fall within the spirit and scope thereof.

What is claimed is:

1. A method of detecting, measuring, and classifying defects in an insulation cover which encloses a metallic conductor, said method including the steps of:

advancing successive increments of the metallic conductor and its insulation cover along an axis past a probe;

generating a pulse train, the count of which is representative of the length of the conductor which is advanced past the probe;

impressing across the insulation cover a voltage having sufficient magnitude to cause electrical current to flow between the probe and the metallic conductor through an insulation defect, the current flow being initiated prior to and terminated subsequent to the defect being advanced past the probe;

counting a portion of the pulse train in response to current flow through the defect to provide a pulse count which is representative of the sum of a distance which is measured along the axis between points where the current flow is initiated and terminated and of the length of the defect;

subtracting a predetermined count from the pulse count to provide a corrected pulse count which is representative of the length of the defect, said predetermined count being representative of the distance between the points along the axis where the current flow is initiated and terminated to compensate for the current flow prior and subsequent to the defect being advanced past the probe; and comparing the corrected pulse count to preset pulse counts which are proportional to defect length categories to classify the defect.

2. The method of claim 1, which also includes the step of accumulating the number of occurrences of each category of defect in a length of the insulation covered conductor.

3. The method of claim 1, wherein the probe is nonplanar and the predetermined count also compensates for the thickness of the probe as measured along the path of travel.

4. The method of claim 1, wherein said step of subtracting includes the steps of blocking the portion of the pulse train for a predetermined length which corresponds to the distance along the conductor between which current flows prior and subsequent to the defect being advanced past the probe, and then releasing the corrected pulse count.

5. A method of classifying defects in conductor insulation, said method including the steps of:

advancing successive increments of a metallic conductor covered by insulation along a path of travel past a probe;

generating a pulse train, the count of which is representative of the length of the conductor being advanced past the probe;

impressing a voltage across the insulation between the probe and the metallic conductor, the voltage having sufficient magnitude to cause an electrical current flow to be established between the probe and the metallic conductor through an insulation defect, the current flow being initiated a first distance prior to and being terminated a second distance subsequent to the defect being advanced past a plane which extends through the probe and which is normal to the path of travel;

counting a portion of the pulse train in response to an insulation defect being advanced past the probe to provide a pulse count which is representative of a length which is measured along the path of travel of the conductor and which is equal to the sum of the first and second distances and of the thickness of the probe and of the length of the defect;

subtracting a predetermined count from the pulse count to provide a corrected pulse count which is representative of the length of the defect, said predetermined count being representative of the sum of the first and second distances and of the thickness of the probe to compensate for the flow of the current prior and subsequent to the defect being advanced past the probe and for the thickness of the probe, and then releasing the corrected pulse count; and comparing the corrected pulse count to preset pulse counts which are proportional to defect length categories to classify the defect.

6. The method of claim 5, which also includes the steps of accumulating the number of occurrences of each category of defect in a length of the insulated conductor, and comparing the accumulated number of each category of defect with stored values.

7. The method of claim 6, which also includes the step of discontinuing the step of advancing the conductor in response to an accumulated number of defects being greater than a stored value.

8. The method of claim 5, wherein the step of generating a pulse train includes generating a train of pulses proportional to the length of the conductor being advanced past the probe and providing the train of pulses to a gate, opening the gate in response to an insulation defect being advanced into the vicinity of the probe and holding the gate open until the insulation defect has passed the probe.

9. The method of claim 8 which also include the step of providing a pulse signal from the gate in response to the gate being opened, the signal being provided to a comparator which provides the corrected pulse count and to a device which delays the pulse count until said corrected pulse signal has been classified with respect to the defect length categories.

10. An apparatus for detecting, measuring, and classifying defects in an insulation cover which encloses a metallic conductor and, said apparatus including:

a probe;

moving means for advancing successive increments of the metallic conductor covered by insulation along an axis past said probe;

means for generating a pulse train, the count of which is representative of the length of the conductor which is advanced past said probe;

means connected to said probe for impressing a voltage across the insulation cover between the probe and the metallic conductor, the voltage having sufficient magnitude to cause an electrical current to flow between said probe and the metallic conductor through an insulation defect and to cause the current flow to be initiated prior and terminated subsequent to the defect being advanced past said probe;

means for counting a portion of the pulse train in response to current flow through the defect to provide a pulse count which is representative of the sum of a distance which is measured along the axis between points where the current flow is initiated and terminated and of the length of the defect;

means for subtracting a predetermined count from said portion of the pulse train to provide a corrected pulse count which is representative of the length of the defect, said predetermined count being representative of the distance between the points along the axis where the current flow is initiated and terminated to compensate for the flow of the current prior and subsequent to the defect being advanced past said probe; and means for comparing the corrected pulse count to preset pulse counts which are proportional to defect length categories to classify the defect.

11. The apparatus of claim 10, which also includes means for accumulating the number of occurrences of each category of defect in a length of the insulated conductor.

12. An apparatus for detecting, measuring, and classifying defects in insulation which covers a metallic conductor, said apparatus including:

means for advancing the conductor along a path of travel;

means for generating a pulse train, the count of which is a measure of length of the conductor;

means for processing the pulse train to measure the velocity of the conductor;

probe means for engaging the conductor as it is being advanced, said probe being substantially normal to the path of travel of the conductor;

means connected to said probe means for causing a current flow in response to an insulation defect of the conductor being advanced past said probe means, said means including means for impressing a voltage across the insulation between said probe means and said metallic conductor, the voltage being relatively high and causing current flow prior to and subsequent to the defect being advanced past a plane of said probe means;

gate means for causing a portion of the pulse train to be measured to provide a pulse count being representative of the sum of a distance which is measured along the path of travel of the metallic conductor between the initiation and termination of the current flow and of the length of the defect;

measuring means for storing the pulse count to cause a predetermined count to be subtracted from the stored pulse count to compensate for the flow of current prior to and subsequent to the defect being advanced past said probe means and to provide a corrected pulse count which is representative of the length of the defect;

comparator means connected to said measuring means for comparing the corrected pulse count corresponding to the length of the insulation defect with stored pulse counts which correspond to defects of predetermined length to classify the defect; and means connected to said comparator means for counting the number of occurrences of defects of each of the predetermined lengths.

13. The apparatus of claim 12, wherein said comparator means is a first comparator means and said apparatus also includes second comparator means for comparing the accumulated number of defects of each said predetermined length with stored quantities.

14. The apparatus of claim 13, which also includes means responsive to the accumulated number of a particular defect being equal to a stored quantity for discontinuing the advance of the conductor.

15. The apparatus of claim 12, wherein as a defect is advanced toward, past, and beyond said probe means, an arc is caused to occur between said probe means and the metallic conductor, and said measuring means including means for releasing the corrected pulse count to said comparator after the predetermined count has been subtracted from the pulse count to offset the effect of the occurrence of the arc prior to and subsequent to the defect being advanced past said probe means.

16. The apparatus of claim 12, wherein said probe means is non-planar and the predetermined count also compensates for the thickness of said probe means as measured along the path of travel.

17. The apparatus of claim 12, wherein said measuring means includes means for blocking the pulse train for a predetermined length which corresponds to the distance along the metallic conductor during which current flows prior and subsequent to the defect passing the probe means and means for releasing the corrected pulse count.

18. The apparatus of claim 13, wherein said means for generating a pulse train includes means for generating a train of pulses proportional to the length of the conductor and for causing the train of pulses to be provided to said gate means, said gate means being caused to be opened in response to an insulation defect being advanced into the vicinity of said probe means and to be closed after the defect has been advanced past said probe means.

19. The apparatus of claim 18, wherein said gate means provides the pulse count to said measuring means and to a delay means which is connected to said second comparator means, said second comparator means being operated upon receipt of signals from said first comparator means and said gate means, and said delay means being effective to delay the portion of the pulse train to said second comparator means until the corrected pulse count has been classified by said first comparator means.

20. Apparatus for detecting, measuring, and classifying defects in an insulation cover of an insulated metallic conductor, said apparatus including:

means for advancing the insulated conductor along a path of travel;

means including a probe which is positioned along the path of travel for impressing a voltage across the insulation cover between the probe and the metallic conductor to cause electrical current to flow through an insulation defect and provide a signal, the current flow being caused to occur a first distance prior to and to terminate a second distance subsequent to the defect being advanced past said probe;

means for generating a pulse train, the count of which is representative of the length of the conductor being advanced past said probe;

first gate means connected to said impressing means and to said generating means and responsive to receiving a signal from said impressing means in response to the current flow and the pulse train from said generating means for providing as an output a pulse count which is a measurement of the sum of the length of the insulation defect being advanced past the probe and of the first and second distances and of the thickness of the probe;

counting means which is connected to said first gate means and which receives the pulse count from said first gate means for holding the pulse count for a predetermined length along the insulated conductor which corresponds to the sum of the first and second distances and the thickness of the probe and for releasing a corrected pulse count which is proportional to the length of the defect;

first display means connected to said counting means for receiving said corrected pulse count and for classifying the insulation defect by category according to its length, said first display means including a comparator means for providing a signal from a first output as a pinhole is identified, a signal from a second output as a fault is identified and a signal from a third output as a bare wire defect is identified;

second display means for displaying cumulative numbers of each category of defect;

means connected to said first gate means and to said second display means and including a plurality of second gate means which are associated with said first, second, and third outputs of said comparator means for providing output signals to said second display means, each of said second gate means caused to be opened upon the receipt of a signal from an associated output of said comparator means and the pulse count from said first gate means; and means interposed between said first and second gate means for delaying the pulse count from said first gate means until the insulation defect has been classified to open only that one of said second gate means which is associated with the output of said comparator means that corresponds to the identified defect to thereby cause a signal to be provided to said second display means in accordance with the identified defect category.

* * * * *